(12) United States Patent
Cheng et al.

(10) Patent No.: US 8,241,924 B2
(45) Date of Patent: Aug. 14, 2012

(54) METHOD AND SYSTEM FOR CONTROLLING AN IMPLANTATION PROCESS

(75) Inventors: Nai-Han Cheng, Hsinchu (TW); Chyi Shyuan Chern, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 246 days.

(21) Appl. No.: 12/394,201

(22) Filed: Feb. 27, 2009

(65) Prior Publication Data

US 2010/0221849 A1    Sep. 2, 2010

(51) Int. Cl.
*H01L 21/66* (2006.01)
*G01R 31/26* (2006.01)

(52) U.S. Cl. ............... 438/14; 438/514; 250/492.21; 250/492.22

(58) Field of Classification Search ............ 438/14, 438/514; 250/492.2, 492.21, 492.22
See application file for complete search history.

(56) References Cited

U.S. PATENT DOCUMENTS

| 5,003,183 | A  | * | 3/1991 | Nogami et al. | 250/492.2 |
| 5,672,882 | A  | * | 9/1997 | Day et al. | 250/492.21 |
| 7,208,330 | B2 | * | 4/2007 | Collins et al. | 438/14 |
| 2003/0184769 | A1 | * | 10/2003 | Houge et al. | 356/636 |
| 2006/0240651 | A1 | * | 10/2006 | Renau et al. | 438/527 |
| 2008/0067438 | A1 | * | 3/2008 | Halling | 250/492.21 |
| 2009/0224180 | A1 | * | 9/2009 | Aigner | 250/492.22 |

FOREIGN PATENT DOCUMENTS

JP    0787083    2/1991

OTHER PUBLICATIONS

Korean Patent Office, Office Action dated Jun. 20, 2011, Application No. 10-2010-0006166, 14 pgs.

* cited by examiner

*Primary Examiner* — Leonard Chang
(74) *Attorney, Agent, or Firm* — Haynes and Boone, LLP

(57) ABSTRACT

A method for implant uniformity is provided that includes determining a variation of critical dimensions (CD) of a semiconductor wafer, moving the semiconductor wafer in a two-dimensional mode during an implantation process, and controlling a velocity of the movement of the semiconductor wafer so that an implant dose to the semiconductor wafer is varied based on the variation of CD.

13 Claims, 5 Drawing Sheets

METHOD AND SYSTEM FOR CONTROLLING AN IMPLANTATION PROCESS

BACKGROUND

In semiconductor manufacturing technology, the critical dimension (CD) of a mask or wafer are becoming continually smaller for process technologies. It is important that the uniformity of the CD for various patterns (e.g., line width or line spacing), referred to as CD uniformity, remains at acceptable levels. However, CD variation may still have an adverse effect on subsequent processing. For example, an implantation process that forms various doped features such as lightly doped source/drain features of transistors may not be uniform across the semiconductor wafer due to CD variation of gate widths. Accordingly, performance characteristics of the transistors such as threshold voltage may fluctuate from die to die which can lead to poor device performance and low yield.

SUMMARY

One of the broader forms of the present disclosure involves a method for controlling an implantation process. The method includes determining a variation of critical dimensions (CD) of a semiconductor wafer, moving the semiconductor wafer during an implantation process, and controlling a velocity of the movement of the semiconductor wafer so that an implant dose to the semiconductor wafer is varied based on the variation of CD.

Another broader forms of the present disclosure involves a method for controlling an implantation process. The method includes providing a semiconductor wafer having a plurality of features formed thereon, determining a first critical dimension (CD) of features located in a first zone of the semiconductor wafer and a second critical dimension (CD) of features located in a second zone of the semiconductor wafer, implanting ions into the semiconductor wafer while the semiconductor wafer is being scanned in a two-dimensional mode. The semiconductor wafer is scanned at a first velocity when the ions are being implanted into the first zone and at a second velocity different from the first velocity when the ions are being implanted into the second zone.

Yet another broader forms of the present disclosure involves a system for controlling an implantation process. The system includes a table operable to secure a semiconductor wafer, a mechanism coupled to the table and operable to move the semiconductor wafer during the implantation process, an implantation tool operable to provide an ion beam for implanting ions into the semiconductor wafer as it is being moved, and a controller. The controller is operable to receive information associated with a variation of critical dimensions (CD) of the semiconductor wafer and control a velocity of the movement of the semiconductor wafer so that an implant dose into the semiconductor wafer is varied based on the information associated with the variation of CD.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
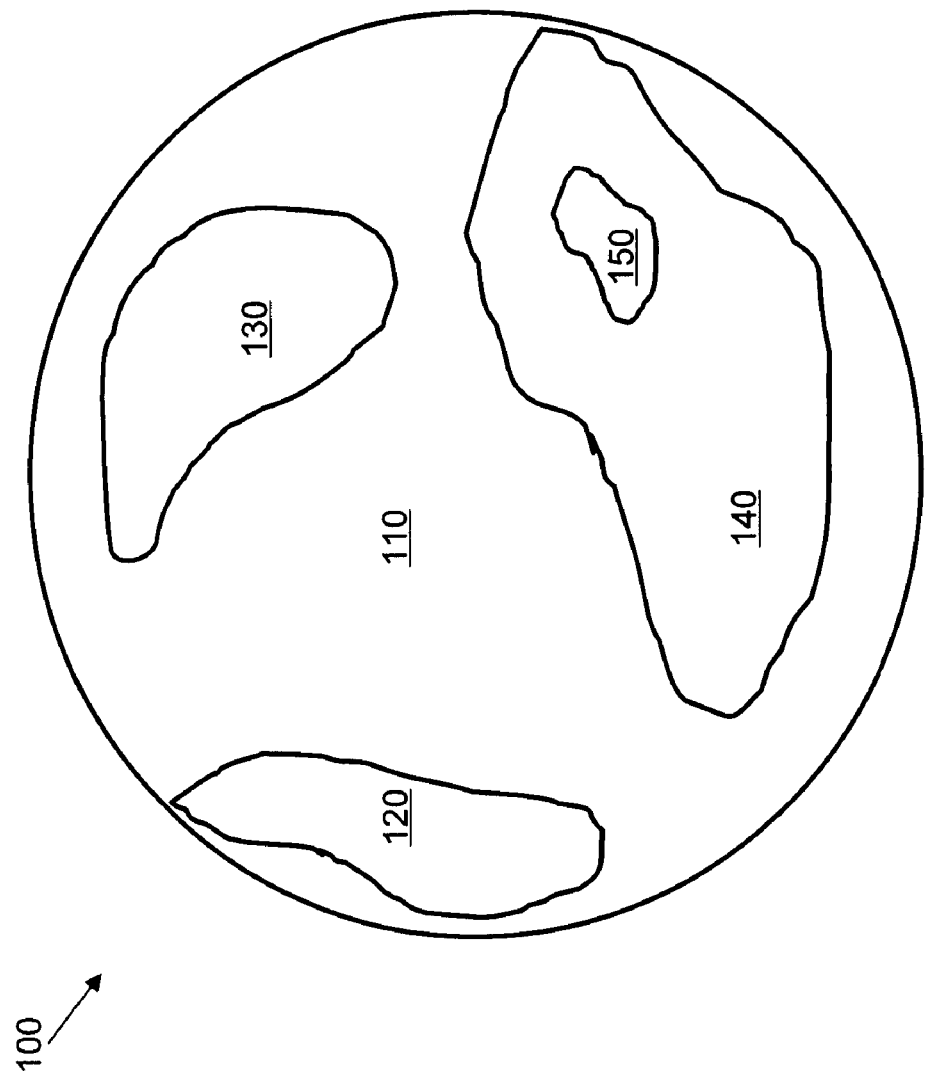
FIG. 1 illustrates a top view of a semiconductor wafer with a variation of critical dimensions (CD)

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a diagram illustrating a variation of critical dimensions (CD) of a semiconductor wafer 100 following a patterning process. The semiconductor wafer 100 includes a semiconductor substrate comprising silicon. It is understood that various features such as doped regions (e.g., n-well or p-well), isolation structures, and dielectric layers may be formed but are not illustrated for the sake of simplicity and clarity. The semiconductor wafer 100 includes a plurality of dies, each die having an integrated circuit formed therein. In the present embodiment, the semiconductor wafer 100 has been processed to form a pattern of lines that make up a plurality of gate structures of transistors for each die.

The gate structures include a gate dielectric and a gate electrode. The gate structures may be formed by any suitable process. For example, the gates structures may be formed by conventional deposition, photolithography patterning, and etching processes (gate patterning). The photolithography patterning processes may include photoresist coating (e.g., spin-on coating), soft baking, mask aligning, exposure, post-exposure baking, developing the photoresist, rinsing, drying, other suitable processes, and/or combinations thereof. The exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate structures may be formed by any combination of the processes described herein.

The photoresist layer is stripped following the etching process. The gate structures are inspected (e.g., after stripping inspection (ASI)) to determine a critical dimension (CD) of the semiconductor wafer 100. In the present embodiment, the critical dimension that is determined includes a line width of the gate structures. The size of the line width depends on the process technology (e.g., 90 nm, 65 nm, 45 nm, etc.) that is implemented to form the line pattern. The line widths are measured at various positions on the semiconductor wafer 100 using a suitable CD metrology instrument such as CD-scanning electron microscopy (CD-SEM) known in the art. An image of the line pattern may be taken by the CD-SEM tool before or at this step. Alternatively, the metrology instrument may optionally include cross-section SEM (X-SEM), transmission electron microscopy (TEM), atomic force microscopy (AFM), or other suitable tool. The number of samples taken and location of the samples may vary. Various metrics for characterizing the line widths may be determined from the image such as mean, deviation (e.g., 3-sigma standard deviation), and range. The information obtained from measuring the line widths may be fed back to adjust a recipe or to tune the patterning and/or etching process for a next wafer to be processed. The information is also evaluated to determine a variation of critical dimensions (CD) across the semiconductor wafer 100 including from die to die.

For example, a map may be generated that shows a variation of critical dimensions (CD) in a plurality of areas 110, 120, 130, 140, and 150 on the semiconductor wafer 100. Each area 110, 120, 130, 140, or 150 on the wafer 100 includes gate structures that have similar line widths as determined by the metrology instrument. In the present embodiment, the map depicts a variation of CD that is random with no particular trend. It has been observed that the map may depict trends such as a dual side trend (e.g., a variation of CD on a left side is similar to a variation of CD on right side of the wafer), a tilt trend (e.g., a variation of CD increases from the left side to the right side of the wafer or vice versa), or a ring-type trend (e.g., a variation of CD is within concentric rings on the wafer). It is understood that the number, size, shape, and location of the areas 110, 120, 130, 140, and 150 in the map may vary.

Figure 2:
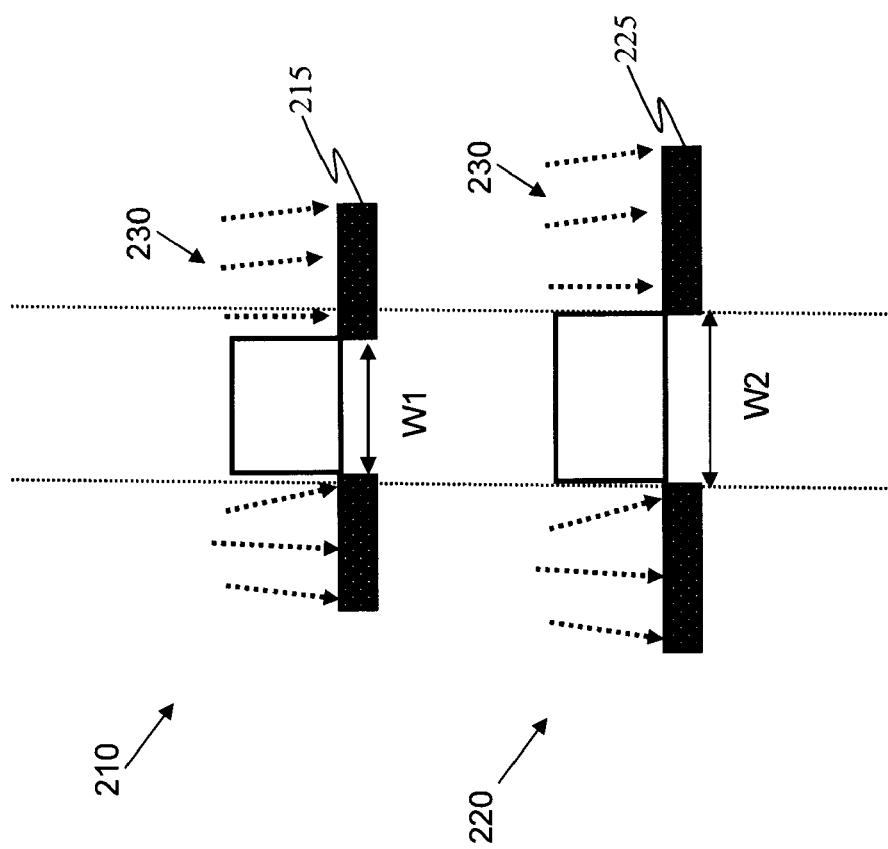
FIG. 2 illustrates a cross-sectional view of an implantation process being performed to a semiconductor wafer with varying critical dimensions (CD)

Now referring also to FIG. 2, illustrated is a cross-sectional view of an implantation process being performed on a semiconductor wafer having varying critical dimensions. The semiconductor wafer is shown with two gate structures 210, 220 having different critical dimensions for the sake of simplicity and clarity. The gate structures 210, 220 are illustrative of the gate structures formed on the semiconductor wafer 100 of FIG. 1. The gate structures 210, 220 may be formed in different dies or may be formed within the same die. The gate structure 210 has a width W1 that is smaller than a width W2 of the gate structure 220. After stripping the photoresist layer, an ion implantation process 230 is performed to the semiconductor wafer 100 to form lightly doped source/drain regions 215, 225 at opposing sides of the gate structures 210, 220. The implantation process 230 may utilize p-type dopants, such as boron or $BF_2$; n-type dopants, such as phosphorus or arsenic; and/or combinations thereof. It has been observed that the implantation process 230 effects various performance characteristics such as threshold voltage, and that the threshold voltage may fluctuate due to different widths of the gate structures (variation of CD). Accordingly, a transistor having the gate structure 210 may operate at a different threshold voltage as compared to a transistor having the gate structure 220. The issue with variation of CD will be exacerbated as the semiconductor industry moves towards larger wafers (e.g., 450 mm) for fabricating chips.

Figure 3:
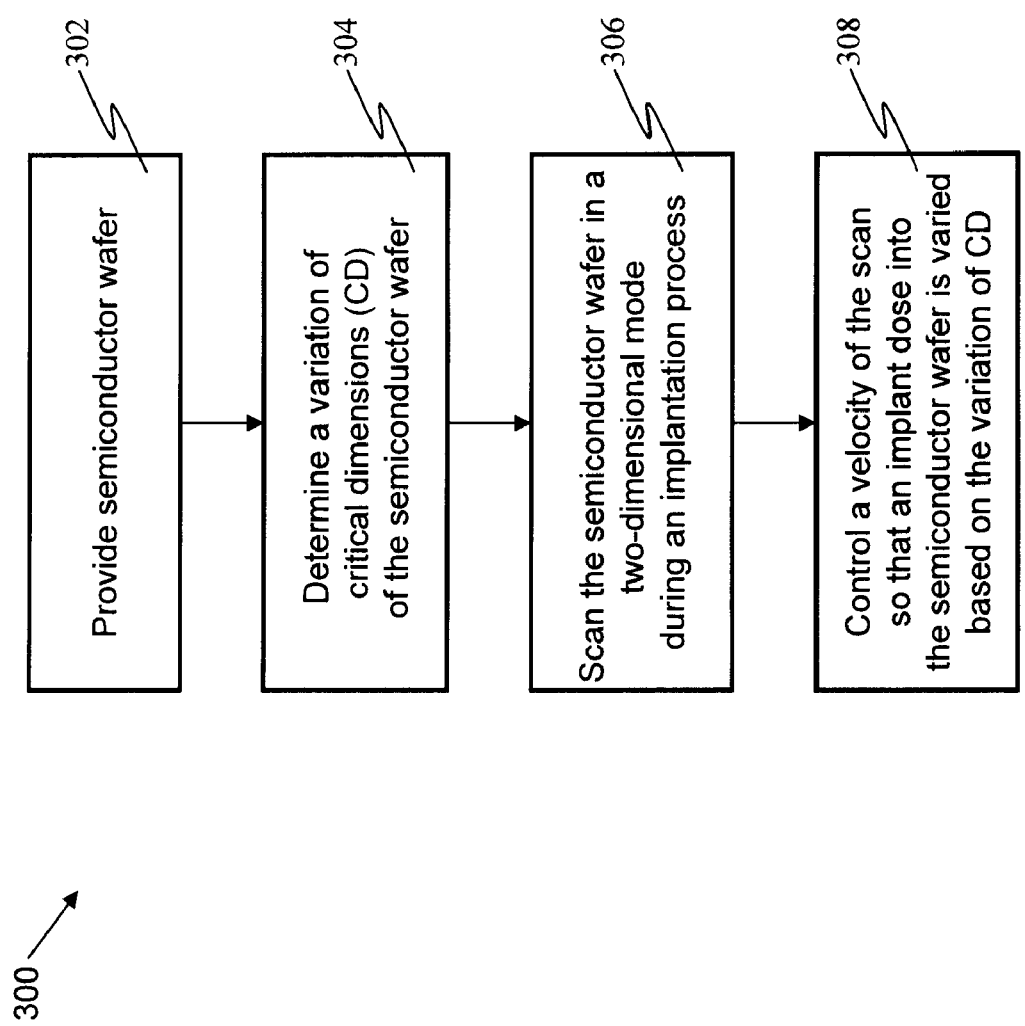
FIG. 3 illustrates a flowchart of a method for controlling an implantation process according to various aspects of the present disclosure.

Referring to FIG. 3, illustrated is a flowchart of a method 300 for controlling an implantation process according to an embodiment of the present disclosure. The method 300 begins with block 302 in which a semiconductor wafer is provided. The semiconductor wafer is similar to the semiconductor wafer 100 of FIG. 1. The semiconductor wafer has been processed to form a line pattern for a plurality of gate structures. The method 300 continues with block 304 in which a variation of critical dimensions (CD) of the semiconductor wafer is determined. The semiconductor wafer undergoes an after stripping inspection (ASI) to measure critical dimensions of the line widths of the gate structures across the wafer. A wafer mapping (x,y) of point to point critical dimensions depicts a variation of CD as was discussed above in FIG. 1.

The method 300 continues with block 306 in which the semiconductor wafer is scanned in a two-dimensional mode during an implantation process. The semiconductor wafer is transported to an implantation tool for processing. The information associated with the variation of CD on the map is fed forward and provided to an Advanced Process Control (APC) system. The APC system processes the information to control the implantation tool and a scanning mechanism that scans the semiconductor wafer during the implantation process. The scanning is performed in a two-dimensional mode based on the CD map provided by the metrology tool. The method 300 continues with block 308 in which a velocity of the scanning is controlled so that an implant dose into the semiconductor wafer is varied based on the variation of CD. The APC system controls a velocity of the scanning mechanism to adjust an implant dose into the semiconductor wafer at various scan positions. The velocity is based on the variation of CD depicted on the map as will be discussed below. The velocity is inversely proportional to the implant dose into the semiconductor wafer as will discussed later. Accordingly, the velocity may be increased to decrease the implant dose, or the velocity may be decreased to increase the implant dose. Thus, controlling the velocity as the semiconductor wafer is scanned in a two-dimensional mode can compensate for the variation of CD of the gate structures which can improve device performance and wafer yield. More details regarding blocks 306 and 308 are discussed with reference to FIG. 5 below.

Figure 4:
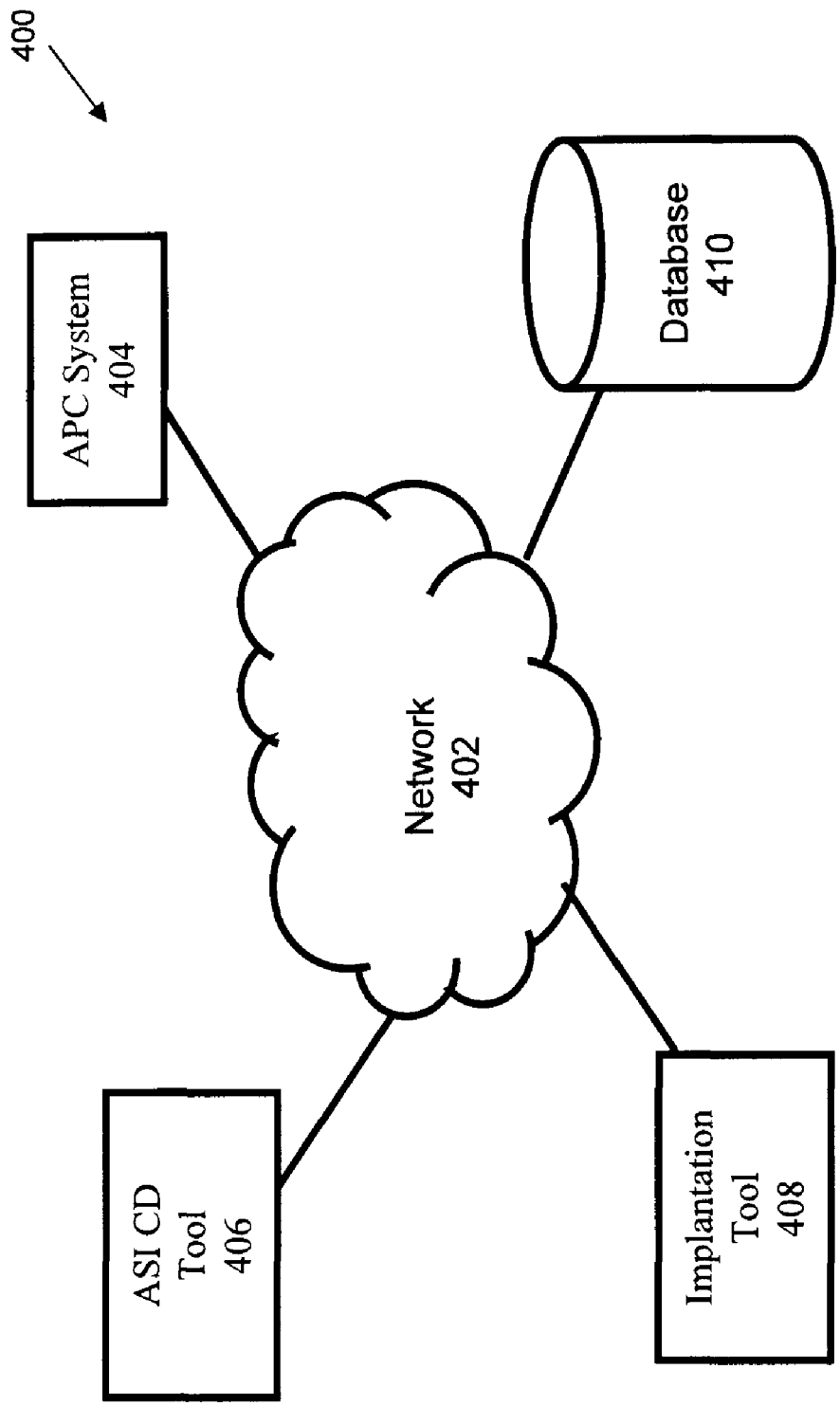
FIG. 4, illustrates a diagrammatic of a system for implementing the method of FIG. 3.

Referring to FIG. 4, a diagram of one embodiment of a system 400 that may be implemented to perform the method 300 of FIG. 3. The system 400 comprises a plurality of entities that are connected by a communications network 402. The network 402 may be a single network or may be a variety of different networks, such as an intranet and the Internet, and may include both wired and wireless communication channels. Each entity may interact with other entities and may provide services to and/or receive services from the other entities. In the present embodiment, the entities include an APC system 404, an ASI CD metrology tool 406, an implantation tool 408, and a database 410. After stripping the photoresist, a semiconductor wafer undergoes an inspection to measure critical dimensions by the ASI CD metrology tool 406. The information associated with the critical dimensions (CD) of the wafer is fed forward to control a subsequent implantation process to the wafer. For example, the CD information may be collected by or provided to the APC system 404 and stored in the database 410. Aspects of the present disclosure may be implemented within the APC system 404 to analyze information either from the ASI CD metrology tool 406 or the database 410. The semiconductor wafer is transported to the implantation tool 408 for the implantation process. The implantation tool 408 is operable to implant ions via an ion bean as is known in the art. Based on the CD information, the APC system 404 controls a velocity of a scanning mechanism that is used in conjunction with the implantation tool 408 as the wafer is scanned and ions are implanted at different positions on the wafer. It should be noted that aspects of the present disclosure may be implemented as a software application executing within the APC system 404 or any other data processing system.

Figure 5:
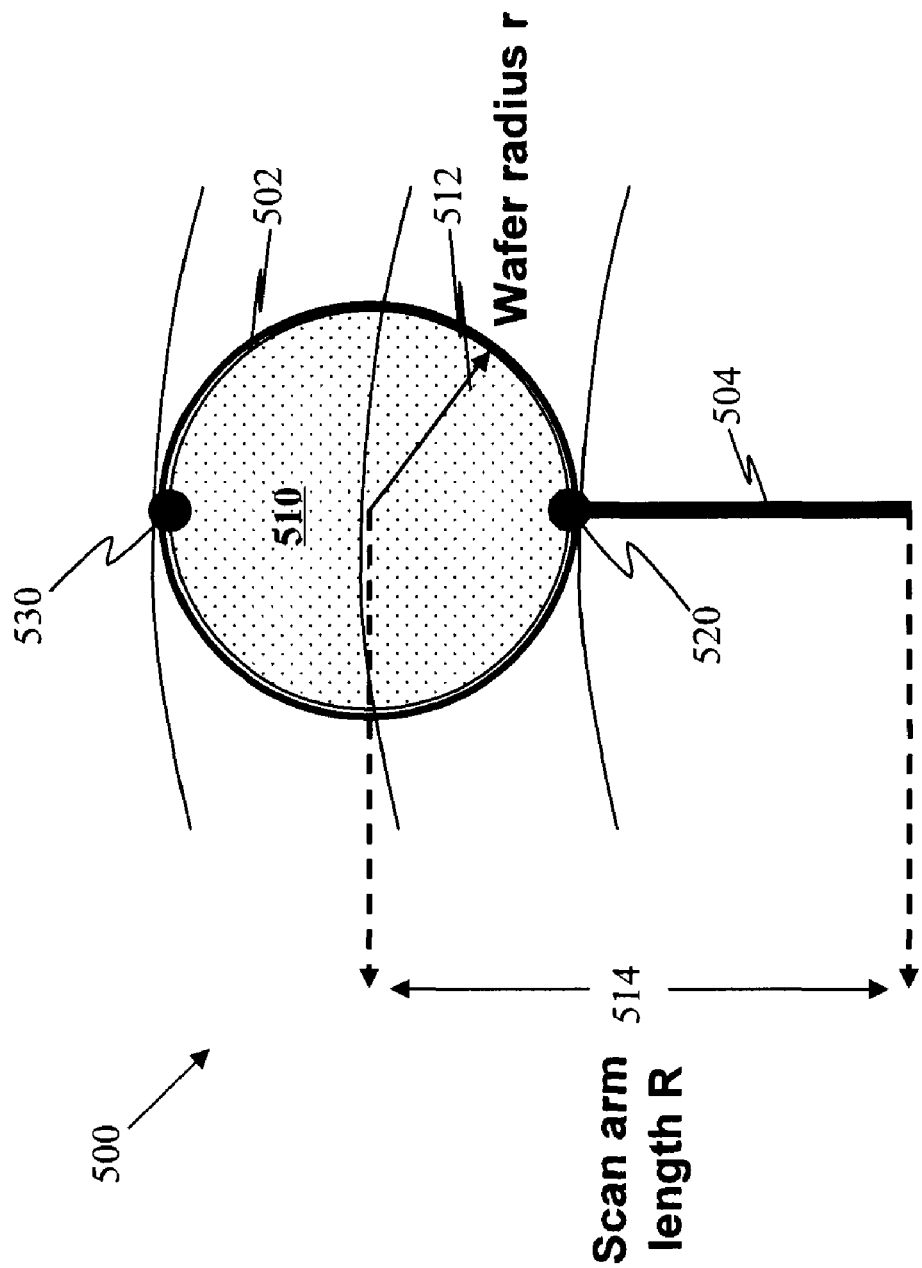
FIG. 5 illustrates a diagrammatic view of a scanning mechanism that may be utilized in an implantation process.

Referring to FIG. 5, illustrated is a scanning mechanism 500 that may be used in an implantation process according to an embodiment of the present disclosure. The scanning mechanism 500 comprises a table 502 and a scan arm 504. It is understood that the scanning mechanism 500 also comprises motors, couplers, controllers, sensors, and other components but is simplified for the sake of clarity. The table 502 is operable to hold and secure a semiconductor wafer 510 during processing. The table 502 may hold the wafer 510 via vacuum force or other suitable technique. The semiconductor wafer 510 has a radius (r) 512. The scan arm 504 has a length (R) 514 with one end coupled to a center portion of the table 502 and an opposite end coupled a motor (not shown) that rotates the scan arm 504 at an angular velocity expressed in degrees/sec. In the present embodiment, the length (R) 514 is about 90 cm. The scanning mechanism 500 may be operatively coupled to an APC system (similar to the APC system 404 of FIG. 4) that controls the angular velocity of the scan arm 504 and a position on the semiconductor wafer 510 relative to an ion beam provided by the implantation tool (not shown). The angular velocity of the semiconductor wafer 510 may be determined from a linear velocity as will be discussed below. Accordingly, the APC system is operable to scan the semiconductor wafer 510 in a two-dimensional mode during an implantation process to compensate for the variation of CD across the semiconductor wafer.

A linear velocity (V) of the scanning may be determined by the following equation:

$$\frac{\text{ion beam current }(I)}{\text{charge state }(n)*\text{electron charge }(e)*\text{recipe dose }(D)*\text{step size }(Y)} \quad (1)$$

In the above equation (1), the liner velocity (V) may be expressed in cm/sec, the ion beam current (I) in Amperes or coulombs/sec, the charge state (n) in/ion, the electron charge (e) is 1.6E-19 coulombs, the recipe dose (D) in ions/cm$^2$, and the step size (Y) in cm. Some of the parameters such as ion beam current (I) and step size (Y) may be optimized for a particular implantation tool/implantation process. From equation (1), the linear velocity (V) is inversely proportional to the recipe dose (D). Accordingly, the linear velocity (V) may be increased to decrease the recipe dose (D), or the linear velocity (V) may be decreased to increase the recipe dose. In one embodiment, the recipe dose (D) to form the LDD regions may range from 1E13 ions/cm$^2$ to 5E14 ions/cm$^2$. Thus, by controlling the linear velocity one can adjust the recipe dose (D) of an implantation process and compensate for the variation of CD across the wafer. In an embodiment, a conversion of the linear velocity (V) to an angular velocity (w) is discussed below.

An angular velocity (w) may be expressed in terms of the linear velocity by the following equation:

$$\text{linear velocity }(V)*1/(R)*(180/\text{pi}) \quad (2)$$

In the above equation (2), the angular velocity (w) is expressed in degrees/sec and R is the scan arm length 514.

If equation (2) represents the angular velocity ($w_{center}$) at the center of the semiconductor wafer 510 (assuming that the end portion of the scan arm 504 is substantially aligned with the center of the semiconductor wafer 510), the angular velocity at different scan positions may be adjusted by a correction factor. For example, the angular velocity ($w_{bottom}$) at the bottom portion 520 of the semiconductor wafer 510 can be expressed as:

$$w_{center}*(R-r)/R \quad (3)$$

where r is the radius 512 of the semiconductor wafer 510. It should be noted that the value of r may decrease as the scan position approaches the center of the semiconductor wafer 510.

The angular velocity ($w_{top}$) at the top portion 530 of the semiconductor wafer 510 can be expressed as:

$$w_{center}*(R+r)/R \quad (4)$$

where r is the radius 512 of the semiconductor wafer 510. It should be noted that the value of r may decrease as the scan position approaches the center of the semiconductor wafer 510.

Accordingly, by implementing equations (1)-(4), the APC system can control the angular velocity (w) of the scanning mechanism 500 relative to a scan position on the semiconductor wafer 510 to adjust the implant dose and compensate for the variation of CD across the wafer. Further, an implant-localize dose control algorithm can be expressed as: Actual-Scan-Speed=Nom-Scan-Speed*(1/R)*(Measured-Beam-Current/Initial-Beam-Current) which uses the (1/R) factor to control zone to zone implant dose. It should be noted that the APC system may also control an ion beam peak size of the implantation process to further tune and fix a dopant compensation zone area. For example, the APC system may increase/decrease a width of the ion beam profile to increase/decrease an implant area of the beam. Additionally, the APC system may further control the ion beam using an electric field or other suitable technique.

In summary, the methods and systems disclosed herein provide an efficient and manageable approach in compensating for a variation of CD of a semiconductor wafer in an implantation process. An implant dose may be adjusted by controlling a velocity of the scanning at different scan positions on the wafer based on the variation of CD. The CD of the gate widths are measured in an ASI CD tool, and wafer mapping (x,y) of point to point critical dimensions is performed. The information associated with the mapping is fed forward to be used for a subsequent implantation process. Accordingly, the scanning is performed in a two-dimensional mode corresponding with the mapping, and the velocity of the scanning is increased/decreased to decrease/increase the implant dose which compensates for the variation of CD. The embodiments disclosed herein are applicable to compensate for various CD maps such as dual side map, tilt trend map, ring type map, and random type map. It is understood that different embodiments disclosed herein offer different advantages, and that no particular advantage is necessarily required for all embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method for controlling an implantation process, comprising:
   determining a variation of critical dimensions (CD) of a semiconductor wafer;
   performing an implantation process on the wafer with an ion beam having an initial beam current;
   moving the semiconductor wafer with a scan arm along an arcuate path at an angular velocity during the implantation process; and
   varying the angular velocity of the movement of the semiconductor wafer along the arcuate path during the implantation process so that an implant dose into the semiconductor wafer is varied based on the variation of CD, wherein varying the angular velocity includes determining an actual scan speed of the semiconductor wafer based in part on a ratio of a measured beam current to the initial beam current;
   wherein determining the actual scan speed includes applying an implant-localize control algorithm expressed as: Actual-Scan Speed=Nom-Scan Speed*(1/R)*(Measured-Beam-Current/Initial-Beam-Current), wherein R represents a length of the scan arm.

2. The method of claim 1, wherein the varying the angular velocity includes:
   increasing the velocity to decrease the implant dose into the semiconductor wafer; and
   decreasing the velocity to increase the implant dose into the semiconductor wafer.

3. The method of claim 1,
   wherein the moving the semiconductor wafer further includes:
      securing the semiconductor wafer on a table, a center portion of the semiconductor wafer being substantially aligned with a center portion of the table; and
      coupling the scan arm to the center portion of the table, the table being disposed near one end of the arm and a motor being disposed near an opposite end of the arm; and
      the motor rotating the arm at the angular velocity; and
   wherein the varying the angular velocity includes adjusting the angular velocity of the arm based on a radial distance between the center portion of the semiconductor wafer and a location on the semiconductor wafer where implantation is currently being performed.

4. The method of claim 1, wherein information obtained from the determining the variation of CD is provided to an Advanced Process Control (APC) System to control the varying the angular velocity of the movement of the semiconductor wafer.

5. The method of claim 4, further comprising controlling, by the APC System, an ion beam profile of the implantation process based on the information of the variation of CD.

6. The method of claim 5, wherein the semiconductor wafer is partitioned into a plurality of zones corresponding to the variation of CD; and
   wherein the controlling the ion beam profile includes adjusting an ion beam peak size to tune the implant dose in the plurality of zones.

7. The method of claim 1, wherein the determining the variation of CD includes determining a variation of CD of a plurality of gate structures formed on the semiconductor wafer; and
   wherein the performing the implantation process forms lightly doped source/drain regions at opposite sides of each gate structure.

8. A method for controlling an implantation process, comprising:
   providing a semiconductor wafer having a plurality of features formed thereon;
   determining a first critical dimension (CD) of features located in a first zone of the semiconductor wafer and a second critical dimension (CD) of features located in a second zone of the semiconductor wafer;
   implanting ions into the semiconductor wafer with an ion beam having an initial beam current; and
   moving the semiconductor wafer with a scan arm along an arcuate path during the implanting, the moving including moving the semiconductor wafer at a first angular velocity when the ions are being implanted into the first zone and at a second angular velocity when the ions are being implanted into the second zone, the first angular velocity being a function of the first CD, and the second angular velocity being a function of the second CD, wherein moving the semiconductor wafer includes determining an actual scan speed of the semiconductor wafer based in part on a ratio of a measured beam current to the initial beam current;
   wherein determining the actual scan speed includes applying an implant-localize control algorithm expressed as: Actual-Scan Speed=Nom-Scan Speed*(1/R)*(Measured-Beam-Current/Initial-Beam-Current), wherein R represents a length of the scan arm.

9. The method of claim 8, wherein the plurality of features include a plurality of gate structures; and
   wherein the implanting ions into the semiconductor wafer forms lightly doped source/drain regions disposed at opposing sides of each gate structure.

10. The method of claim 8, wherein the determining the first and second critical dimensions is performed after a stripping process.

11. The method of claim 8, further comprising feeding forward information associated with the first and second critical dimensions to an Advanced Process Control (APC) System to control the moving the semiconductor wafer at the first velocity and the second velocity.

12. The method of claim 8, wherein the second angular velocity is different from the first angular velocity.

13. The method of claim 8,
    wherein the moving the semiconductor wafer further includes:
       securing the semiconductor wafer on a table, a center portion of the semiconductor wafer being substantially aligned with a center portion of the table; and
       coupling the scan arm to the center portion of the table, the table being disposed near one end of the arm and a motor being disposed near an opposite end of the arm; and
       the motor rotating the arm at the angular velocity; and
    wherein the varying the angular velocity includes adjusting the angular velocity of the arm based on a radial distance between the center portion of the semiconductor wafer and a location on the semiconductor wafer where implantation is currently being performed.

* * * * *